United States Patent [19]
Rundel

[11] Patent Number: 5,281,866
[45] Date of Patent: Jan. 25, 1994

[54] REFERENCE VOLTAGE CIRCUIT ALLOWING FAST POWER UP FROM LOW POWER STANDBY CONDITION

[75] Inventor: Bernd M. Rundel, Tucson, Ariz.

[73] Assignee: Burr-Brown Corporation, Tucson, Ariz.

[21] Appl. No.: 67,481

[22] Filed: May 25, 1993

Related U.S. Application Data

[63] Continuation of Ser. No. 780,792. Oct. 22, 1991, abandoned.

[51] Int. Cl.⁵ .......................... G05F 1/10; H03K 3/02
[52] U.S. Cl. ........................ 307/296.3; 307/296.1; 307/296.4; 307/296.5; 307/296.6; 307/296.8; 307/246
[58] Field of Search ............. 307/296.1, 1, 296.6, 307/296.8, 272.3, 353, 246, 240; 328/151; 323/313

[56] References Cited

U.S. PATENT DOCUMENTS

| | | | |
|---|---|---|---|
| 4,029,973 | 6/1977 | Kobayashi et al. | 307/246 |
| 4,112,296 | 9/1978 | Heimbigner | 307/279 |
| 4,165,478 | 8/1979 | Butler et al. | 307/246 |
| 4,334,195 | 6/1982 | Luce | 328/168 |
| 4,344,050 | 8/1982 | Callahan | 333/173 |
| 4,414,639 | 11/1983 | Talambiras | 307/353 |
| 4,623,854 | 11/1986 | Kuraishi | 328/151 |
| 4,716,322 | 12/1987 | D'Arrigo et al. | 307/246 |
| 4,886,983 | 12/1989 | Taka | 307/272.3 |
| 4,922,130 | 5/1990 | Swerlein | 307/353 |
| 4,961,184 | 10/1990 | Owen | 328/151 |

Primary Examiner—William L. Sikes
Assistant Examiner—Terry D. Cunningham
Attorney, Agent, or Firm—Cahill, Sutton & Thomas

[57] ABSTRACT

A reference voltage circuit in an integrated circuit analog-to-digital converter includes a band gap circuit, a first field effect transistor coupling an output conductor of the band gap circuit to a first external bypass capacitor and a non-inverting input of a buffer circuit. A second field effect transistor couples the first conductor to a non-inverting input of the buffer circuit. An output of the buffer circuit is coupled to an inverting input thereof. The first and second field effect transistors are turned on during conversions, during which the first field effect transistor and the first bypass capacitor co-acting to filter high frequency noise produced by the band gap circuit to apply a precise reference voltage to the non-inverting input of the buffer circuit. Between conversions, the first and second field effect transistors are turned off to isolate the first bypass capacitor and preserve its charge, so that the first bypass capacitor does not need to be charged up when the first and second field effect transistors are turned back on.

11 Claims, 3 Drawing Sheets

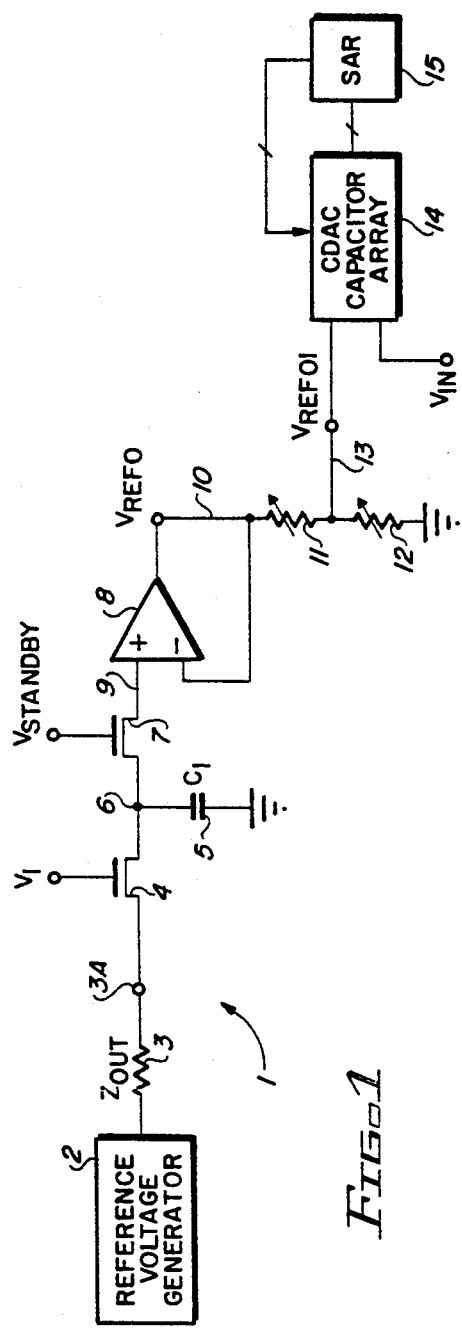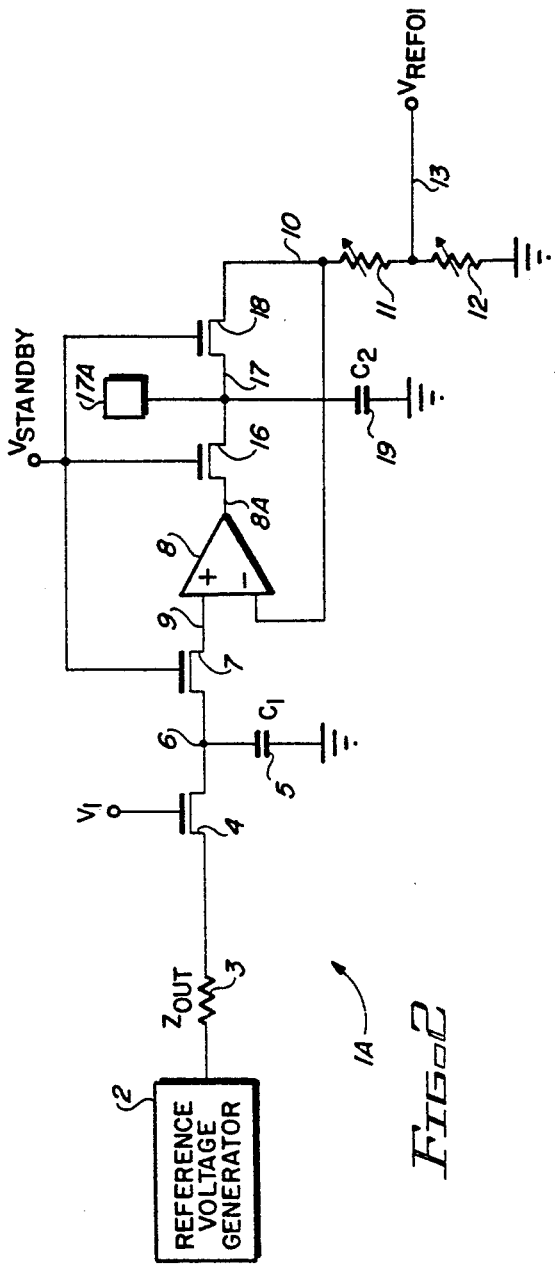

REFERENCE VOLTAGE CIRCUIT ALLOWING FAST POWER UP FROM LOW POWER STANDBY CONDITION

This is a continuation of patent application Ser. No. 07/780,792, filed Oct. 22, 1991, by Bernd M. Rundel and entitled REFERENCE VOLTAGE CIRCUIT ALLOWING FAST POWER UP FROM LOW POWER STANDBY CONDITION, now abandoned.

BACKGROUND OF THE INVENTION

The invention relates to circuitry that permits rapid "power up" from a low power standby mode in which the power supplied to a utilization circuit is sharply reduced during time intervals between full power operations of the utilization circuit. The invention relates more particularly to such circuitry that allows use of external bypass capacitors to reduce noise signals.

Various high precision circuits such as 16 bit ADCs, DACs (digital-to-analog converters) and the like include reference voltage generator circuits. Some voltage generator circuits include a so-called "band gap" circuit. A band gap circuit produces a reference voltage that is proportional to absolute temperature. Often the output of the band gap circuit is coupled to an input of a buffer circuit. The buffer circuit typically has a very low output impedance, and produces a precise output reference voltage equal to the output voltage produced by the band gap circuit. The output reference voltage can be precisely adjusted during manufacture by trimming nichrome resistors or the like to produce the desired internal reference voltage level. For example, the assignee's ADS7800 12 bit analog-to-digital converter includes such band gap and buffer circuitry. The band gap reference voltage generating circuit produces high frequency thermal noise and flicker noise. Also, noise from other sources can appear on the output of the band gap circuit. Such noise typically has frequencies as high as 10 megahertz or higher. Magnitudes of such noise voltages are sufficiently large to cause inaccuracies in the least significant bits of the 12 bit ADC.

There are applications for high resolution ADCs, DACs, etc. in which very low average power consumption is a requirement. In some cases, low average power consumption can be achieved in a high resolution ADC or DAC by switching at least some of the circuitry into a low power consumption "standby" mode between conversions. However, this approach is impractical if large external bypass capacitors must be charged up every time the circuitry is switched from the low power standby mode into a "powered up" condition. Some prior circuits provide an external lead at the output of a buffer circuit having its input connected to the output of the band gap circuit, so that a user needing to filter the flicker noise and thermal noise generated by the band gap circuit can connect an external bypass capacitor of 1 to 10 microfarads to the output of the buffer circuit to low pass filter the voltage on the output of the buffer circuit. Low average power consumption is thereby achieved, but rapid powering up of the circuit is impractical.

There is an unmet need for a precise reference voltage generating circuit having the capabilities of both fast power-up from a low power standby condition and substantial reduction of high frequency noise generated within the reference voltage circuit.

SUMMARY OF THE INVENTION

It is an object of the invention to provide precise reference voltage circuit having fast power up from a low power consumption standby mode and also having effective filtering of high frequency flicker noise, thermal noise, etc. at the output of a band gap circuit.

It is another object of the invention to provide a precise reference voltage circuit which is sufficiently versatile to provide filtering of flicker noise and thermal noise produced by the band gap circuit and decoupling of the band gap circuit to allow substitution of a different voltage reference source and effective filtering of high frequency noise produced by that source and fast power-up from a low power consumption condition.

Briefly described, and in accordance with one embodiment thereof, the invention provides a reference voltage circuit which may be used in an analog-to-digital converter or other utilization circuit. The reference voltage circuit includes a band gap circuit, a first field effect transistor coupling an output conductor of the band gap circuit to a first conductor. The first conductor is coupled to a first external bypass capacitor and a non-inverting input of a buffer circuit. A second field effect transistor couples the first conductor to a non-inverting input of the buffer circuit. An output of the buffer circuit is coupled to an inverting input thereof. In the described embodiments, the first and second field effect transistors are turned on during conversions by an analog-to-digital converter. The first field effect transistor and the first bypass capacitor coact to filter high frequency noise produced by the band gap circuit, to thereby apply a precise reference voltage to the non-inverting input of the buffer circuit. That reference voltage is replicated on the output of the buffer circuit. Between conversions, the first and second field effect transistors are turned off to isolate the first bypass capacitor and preserve its charge, so that the first bypass capacitor does not need to be charged up when the first and second field effect transistors are turned back on. The first field effect transistor can be turned on independently of the second FET, to allow an external reference voltage source, rather than the band gap circuit, to be coupled to the first conductor. In one embodiment, a second bypass capacitor is connected to a second conductor. A third field effect transistor couples the output of the buffer circuit to the second conductor, and a fourth field effect transistor couples the second conductor to a third conductor on which the reference voltage is replicated. A laser trimmable resistive divider circuit is coupled to the output of the buffer circuit to produce an adjusted reference voltage, which is applied to a reference voltage terminal of a CDAC capacitor array of the analog-to-digital converter.

BRIEF DESCRIPTION OF THE DRAWINGS

FIG. 1 is a circuit diagram of one embodiment of the invention.

FIG. 2 is a circuit diagram of another embodiment of the invention.

DETAILED DESCRIPTION OF THE PREFERRED EMBODIMENTS

Figure 3:
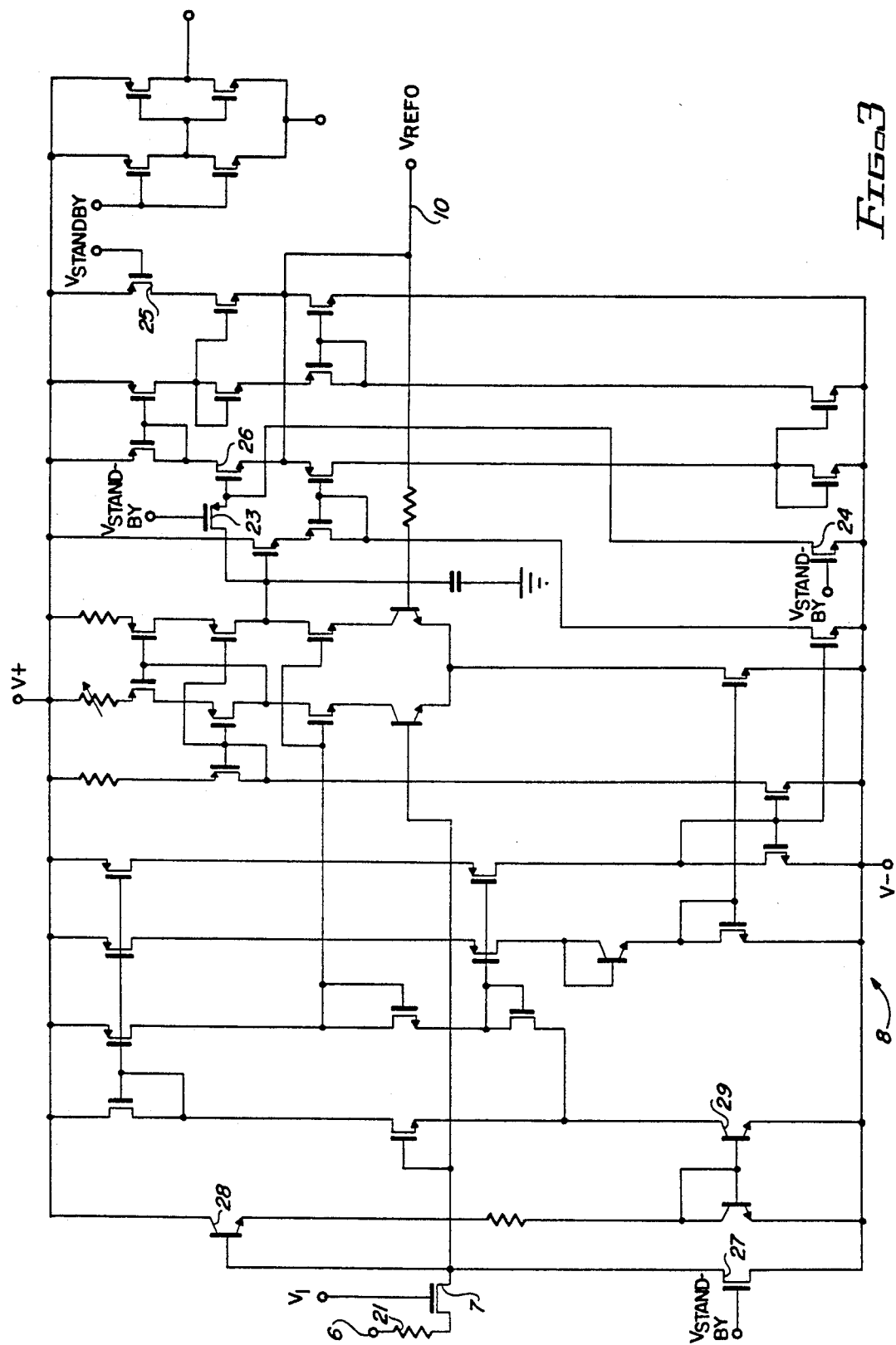
FIG. 3 is a detailed circuit schematic diagram of the buffer circuit included in the embodiments of FIGS. 1 and 2.

Referring to FIG. 1, circuit 1 includes a band gap reference voltage generator circuit 2 having an output impedance designated by numeral 3. The output impedance $Z_{OUT}$ of band gap circuit 2 has a value of approximately 3.5 kilohms. The output of reference voltage generator 2 appears on conductor 3A, which is connected to the source of MOSFET 4. MOSFET 4 can be either a P channel or an N channel MOSFET, depending on the polarity of the control signal $V_1$ to which the gate electrode of MOSFET 4 is connected. The drain of MOSFET 4 is connected by conductor 6 to one terminal of a bypass capacitor 5, the other terminal of which is connected to ground. The capacitance $C_1$ of bypass capacitor 5 typically is 1 to 10 microfarads. Conductor 6 also is connected to the source of MOSFET 7, which also can be either a P channel MOSFET or an N channel MOSFET. The gate electrode of MOSFET 7 is connected to receive a signal $V_{STANDBY}$ which initiates a low power consumption standby mode. The drain of MOSFET 7 is connected by conductor 9 to the non-inverting input of buffer 8. The output of buffer 8 is connected by conductor 10 to the inverting input of buffer 8 and also to one terminal of a laser-trimmable nichrome resistor 11. The voltage $V_{REF0}$ is produced on conductor 10.

The other terminal of resistor 11 is connected by conductor 13 to one terminal of a laser-trimmable resistor 12, the other terminal of which is connected to ground. Resistors 11 and 12 form a trimmable voltage divider. A reference voltage $V_{REF01}$ is produced on conductor 13 and applied to the reference nodes of a CDAC capacitor array 14 of a 16 bit analog-to-digital converter or to another circuit needing a highly precise, low noise reference voltage.

A presently preferred implementation of buffer 8 is shown in the circuit schematic of FIG. 3; this implementation is considered to be exemplary and easily understood by one skilled in the art. Therefore, a detailed description is unnecessary. However, in FIG. 3 NPN transistor 28 supplies a bias current to an NPN current mirror, the output transistor 29 of which establishes a reference current for current mirrors in successive stages of buffer circuit 8. The signal $V_{STANDBY}$ applied to the gate of MOSFET 27 turns off transistor 28, which causes transistor 29 to be turned off, reducing the power consumption of the successive stages to essentially zero. $V_{STANDBY}$ also turns off MOSFET 23 and turns on MOSFET 24, thereby turning MOSFET 26 off and reducing power consumption in that stage to essentially zero. $V_{STANDBY}$ also turns off MOSFET 25, reducing power in the final stage of buffer 8 to essentially zero.

Figure 4:
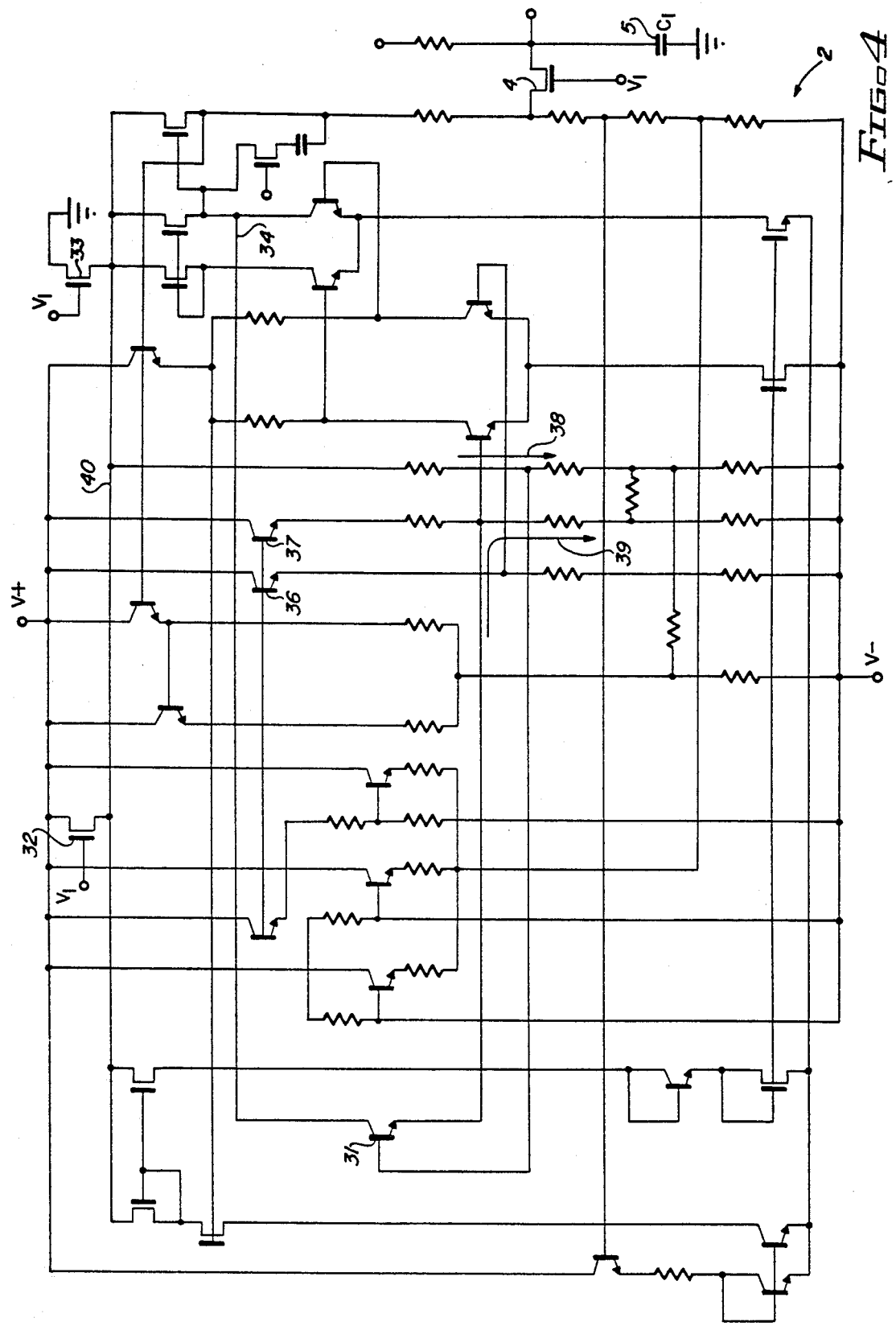
FIG. 4 is a detailed circuit schematic diagram of the reference voltage generator circuit included in the embodiments of FIGS. 1 and 2.

Band gap reference voltage generator circuit 2 can be of conventional design. A suitable bandgap circuit is utilized in the assignee's above-mentioned commercially available ADS7800 12 bit analog-to-digital converter integrated circuit. However, NPN transistor 31 has been added to the prior design to effectuate powering up of band gap circuit 2, as shown in FIG. 4. When the signal $V_1$ turns on MOSFET 32 it also turns off MOSFET 33, which couples conductor 40 to ground. The current 38 immediately establishes a base voltage on transistor 31, causing its emitter to deliver current 39 through the indicated resistors, initiating generation of a band gap voltage by NPN transistors 36 and 37 in a well known manner. The voltage of the emitter of transistor 31 rises enough to turn transistor 31 off after powering up of band gap circuit 2 has been accomplished.

During normal operation of the ADC, MOSFETs 4 and 7 in FIG. 1 are turned on by $V_1$ and $V_{STANDBY}$, respectively. Standby capacitor 5 is fully charged. Band gap reference voltage generator circuit 2 typically produces noise on conductor 3A of as much as 20 to 40 millivolts peak-to-peak at frequencies of up to 10 megahertz or more. The "on" channel resistance of MOSFET 4 is approximately 25 ohms, so that its resistance plus $Z_{OUT}$ coact with the 1 to 10 microfarad capacitance of bypass capacitor 5 to effectively filter out such noise, reducing it by a factor of roughly 1000.

The filtered band gap output voltage present on node 6 is coupled by MOSFET 7 to conductor 9. A relatively small amount of noise generated by buffer circuit 8 is added to the filtered reference voltage $V_9$ present on conductor 9, which noise is included in the reference voltage $V_{REF0}$ produced on conductor 10. The feedback of the voltage on conductor 10 to the non-inverting input of buffer 8 keeps the voltage on conductor 10 essentially the same as the voltage on conductor 9.

It should be appreciated that if low power standby operation is desired, $V_1$ and $V_{STANDBY}$ are controlled to turn MOSFETs 4 and 7 off. This prevents the charge stored on bypass capacitor 5 from leaking through either $Z_{OUT}$ and pulldown devices inside reference voltage generator 2 or the input resistance of buffer 8. If that were to happen, when MOSFETs 4 and 7 are turned back on to "power up" the circuitry 1, approximately 350 milliseconds would be required to charge bypass capacitor 5 up to its normal voltage of about 2.5 volts. This delay would be completely unacceptable in a typical situation wherein the user needs to perform analog-to-digital conversions which require only approximately 25 microseconds each (as is achievable by some present state-of-the-art 16 bit CMOS analog-to-digital converters).

The circuit of FIG. 1 provides good filtering of the high frequency noise produced by reference voltage generator 2, thereby preventing such noise from being stored on bypass capacitor 5 and producing LSB conversion errors. In some instances, the additional noise voltage produced by buffer 8 is sufficiently low as to not be unacceptable.

Referring to FIG. 2, another embodiment of the invention is shown, in which a second bypass capacitor 19, having a capacitance $C_2$ of 1 to 10 microfarads, is connected by conductor 17 to the drain of MOSFET 16 and the source of MOSFET 18. The gate electrodes of MOSFETs 16 and 18 are both connected to receive the voltage $V_{STANDBY}$. The source of MOSFET 16 is connected to the output of buffer 8, and the drain of MOSFET 18 is coupled by conductor 10 to the inverting input of buffer 8 and to laser-trimmable resistors 11 and 12. MOSFETs 16 and 18 can be either N channel or P channel type, depending on the polarity of $V_{STANDBY}$. Conductor 17 is connected to an external integrated circuit package lead so bypass capacitor 19 can be an external capacitor. The operation of the portion of the circuit in FIG. 2 including MOSFETs 4 and 7 and buffer 8 is the same as for the circuit of FIG. 1. High frequency noise produced by buffer circuit 8 is filtered out by the channel resistance of MOSFET 16 and the capacitance of bypass capacitor 19. If the current required to be supplied through conductor 13 is sufficiently low that the resulting voltage drops between the sources and drains of MOSFETs 16 and 18 are negligible over the desired operating temperature range, then the circuit 1A of FIG. 2 can be used to achieve very low internal noise on conductor 13 in combination with fast powering up from a low power standby mode and therefore very accurate LSB conversion by the analog-to-digital converter can be achieved. For example, in a 16 bit analog-to-digital converter a noise voltage of 40 microvolts can cause an LSB conversion error. The above-described circuit reduces the noise voltage on conductor 10 to less than approximately 20 microvolts for channel resistances of roughly 25 ohms for MOSFETs 4, 7, 16, and 18.

If a test pad 17A is provided as sometimes is desired, any current drawn by it through MOSFET 16 is automatically compensated for by the feedback from conductor 10 to the inverting input of buffer 8.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. In an integrated circuit analog-to-digital converter, a reference voltage circuit comprising in combination:
   (a) a band gap circuit having an output conductor and producing thereon a first reference voltage;
   (b) a first field effect transistor coupling the output conductor of the band gap circuit to a first conductor, the first conductor being coupled to a first external bypass capacitor means;
   (c) a buffer circuit;
   (d) a second field effect transistor coupling the first conductor to a non-inverting input of the buffer circuit;
   (e) means for turning the first and second field effect transistors off when low power standby operation of the analog-to-digital converter is desired to prevent discharging of the first external bypass capacitor and thereby avoid a need to recharge the first external bypass capacitor when the first and second field effect transistors are turned back on, the first field effect transistor and the first bypass capacitor means coacting with output impedance of the band gap circuit when the first and second field effect transistors are on to filter high frequency noise produced on the first reference voltage by the band gap circuit to thereby apply a second reference voltage that is more regulated than the first reference voltage to the non-inverting input of the buffer circuit, the reference voltage circuit replicating the second reference voltage to produce a third reference voltage that is more regulated than the first reference voltage at the output of the buffer circuit.

2. In an integrated circuit analog-to-digital converter, the reference voltage circuit of claim 1 wherein the means for turning the first and second field effect transistors off comprises means for turning off the first field effect transistor independently of the second field effect transistor.

3. In an integrated circuit analog-to-digital converter, the reference voltage circuit of claim 1 including a second bypass capacitor means connected to a second conductor, a third field effect transistor coupling the output of the buffer circuit to the second conductor, and a fourth field effect transistor coupling the second conductor to a third conductor, a fourth reference voltage being produced on the third conductor.

4. In an integrated circuit analog-to-digital converter, the reference voltage circuit of claim 1 including a laser trimmable resistive divider circuit coupled to the output of the buffer circuit producing an adjusted reference voltage and applying it to a reference voltage terminal of a CDAC capacitor array of the ADC.

5. In an integrated circuit analog-to-digital converter, the reference voltage circuit of claim 4 wherein the band gap circuit has an output impedance of approximately 3.5 kilohms, and the first bypass capacitor has a capacitance in the range from approximately 1 to 10 microfarads, and the first field effect transistor has an on channel resistance of approximately 25 ohms.

6. In an integrated circuit analog-to-digital converter, the reference voltage circuit of claim 1 including means for coupling an output of the buffer circuit to an inverting input thereof.

7. A reference voltage circuit, comprising in combination:
   (a) a band gap circuit having an output conductor and producing thereon a first reference voltage;
   (b) a first field effect transistor coupling the output conductor of the band gap circuit to a first conductor, the first conductor being coupled to a first external bypass capacitor means;
   (c) a buffer circuit;
   (d) a second field effect transistor coupling the first conductor to a non-inverting input of the buffer circuit;
   (e) means for turning the first and second field effect transistors off when low power standby operation of a utilization circuit operating in response to the reference voltage circuit is desired to prevent discharging of the first external bypass capacitor and thereby avoid a need to recharge the first external bypass capacitor when the first and second field effect transistors are turned back on, the first field effect transistor and the first external bypass capacitor means coacting with output impedance of the band gap circuit when the first and second field effect transistors are on to filter high frequency noise produced on the first reference voltage by the band gap circuit to thereby apply a second reference voltage that is more regulated than the first reference voltage to the non-inverting input of the buffer circuit, the reference voltage circuit replicating the second reference voltage to produce a third reference voltage that is more regulated than the first reference voltage at the output of the buffer circuit.

8. The reference voltage circuit of claim 7 including means for turning off the first field effect transistor independently of the second field effect transistor.

9. The reference voltage circuit of claim 7 including a second bypass capacitor means connected to a second conductor means, a third field effect transistor coupling the output of the buffer circuit to the second conductor, and a fourth field effect transistor coupling the second conductor to a third conductor, a fourth reference voltage being produced on the third conductor.

10. The reference voltage circuit of claim 7 including a laser trimmable resistive divider circuit coupled to the output of the buffer circuit producing an adjusted reference voltage and applying it to a reference voltage terminal of utilization circuit.

11. A method of producing a precise, low noise reference voltage with low average power dissipation, comprising the steps of:
   (a) powering up a band gap circuit having an output conductor and producing thereon a first reference voltage;
   (b) coupling the output conductor of the band gap circuit to a first conductor by turning on a first field effect transistor, the first conductor being coupled to a first external bypass capacitor, and simultaneously filtering high frequency noise produced on the first reference voltage by the band gap circuit to thereby produce a second reference voltage that is more regulated than the first reference voltage on the first conductor;
   (c) coupling the first conductor to a non-inverting input of a buffer circuit means of a second field effect transistor to thereby produce the second reference voltage on the non-inverting input of the buffer circuit, the buffer circuit means replicating the second reference voltage to produce a third reference voltage that is more regulated than the first reference voltage;
   (d) turning the first and second field effect transistors on during powered up operations by a utilization circuit, to cause the channel resistance of the first field transistor and the output impedance of the band gap circuit to coact with the first bypass capacitor to produce the filtering;
   (e) turning the first and second field effect transistors off to begin a power down operation and to prevent discharge of the first bypass capacitor and thereby avoid a need to recharge the first bypass capacitor when the first and second field effect transistors are turned back on.

* * * * *